(12) United States Patent
Stainer (10) Patent No.: US 10,157,652 B2
(45) Date of Patent: Dec. 18, 2018

(54) MAGNETIC DEVICE CONFIGURED TO PERFORM AN ANALOG ADDER CIRCUIT FUNCTION AND METHOD FOR OPERATING SUCH MAGNETIC DEVICE

(71) Applicant: CROCUS Technology SA, Grenoble (FR)

(72) Inventor: Quentin Stainer, Montbonnot-St-Martin (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 15/578,841

(22) PCT Filed: May 31, 2016

(86) PCT No.: PCT/IB2016/053195
§ 371 (c)(1),
(2) Date: Dec. 1, 2017

(87) PCT Pub. No.: WO2016/193908
PCT Pub. Date: Dec. 8, 2016

(65) Prior Publication Data
US 2018/0158497 A1    Jun. 7, 2018

(30) Foreign Application Priority Data
Jun. 5, 2015    (EP) .................................. 15290151

(51) Int. Cl.
*G11C 11/00* (2006.01)
*G11C 11/16* (2006.01)
(Continued)

(52) U.S. Cl.
CPC .............. *G11C 11/161* (2013.01); *G06G 7/14* (2013.01); *G11C 11/1659* (2013.01);
(Continued)

(58) Field of Classification Search
CPC .............. G11C 11/161; G11C 11/1659; G11C 11/1673
(Continued)

(56) References Cited

U.S. PATENT DOCUMENTS

| 8,400,066 B1 * | 3/2013 | Pileggi .................. G11C 11/161 315/152 |
| 2006/0092689 A1 | 5/2006 | Braun et al. |
| 2012/0306536 A1 * | 12/2012 | Shukh .................. H03K 19/215 326/52 |

FOREIGN PATENT DOCUMENTS

| EP | 2712078 A1 | 3/2014 |
| WO | 2013123363 A1 | 8/2013 |

OTHER PUBLICATIONS

International Search Report for PCT/IB2016/053195 dated Jul. 28, 2016.
Written Opinion for PCT/IB2016/053195 dated Jul. 28, 2016.

* cited by examiner

*Primary Examiner* — Vu Le
(74) *Attorney, Agent, or Firm* — Pearne & Gordon LLP (57) ABSTRACT

A magnetic device configured to perform an analog adder circuit function and including a plurality of magnetic units. Each magnetic unit includes n magnetic tunnel junctions electrically connected in series via a current line. Each magnetic tunnel junction includes a storage magnetic layer having a storage magnetization, a sense magnetic layer having a sense magnetization, and a tunnel barrier layer. Each magnetic unit also includes n input lines, each being configured to generate a magnetic field adapted for varying a direction of the sense magnetization and a resistance of the n magnetic tunnel junctions, based on an input. Each of the n magnetic units is configured to add said n inputs to generate an output signal that varies in response to the n resistances.

11 Claims, 4 Drawing Sheets

(51) Int. Cl.
  *H03F 15/00*  (2006.01)
  *G06G 7/14*  (2006.01)
  *H01F 10/32*  (2006.01)
  *H01L 43/08*  (2006.01)

(52) U.S. Cl.
  CPC ...... *G11C 11/1673* (2013.01); *G11C 11/1675* (2013.01); *H01F 10/3254* (2013.01); *H01L 43/08* (2013.01); *H03F 15/00* (2013.01); *H01F 10/3286* (2013.01)

(58) Field of Classification Search
  USPC .................................................. 365/145, 158
  See application file for complete search history.

MAGNETIC DEVICE CONFIGURED TO PERFORM AN ANALOG ADDER CIRCUIT FUNCTION AND METHOD FOR OPERATING SUCH MAGNETIC DEVICE

FIELD

The present invention concerns a magnetic device configured to perform an analog adder circuit function. The present invention concerns a method for operating the magnetic device.

DESCRIPTION OF RELATED ART

Addition of analog signals is a fundamental operation in signal theory and has many applications, for instance, in audio with mixing consoles. Addition of analog signals is typically performed by using a summing amplifier, or adder, circuit based on operational amplifiers.

However, operational amplifiers are typically limited in bandwidth. Moreover, operational amplifiers feature output noise even in the absence of input and can be easily destroyed by voltage overshoots in the inputs, etc. As a result, for some applications, specific operational amplifier designs are required, usually leading to a significant cost increase.

EP2712078 discloses a magnetic logic unit (MLU) cell comprising: a first magnetic tunnel junction and a second magnetic tunnel junction, each magnetic tunnel junction comprising a first magnetic layer having a first magnetization, a second magnetic layer having a second magnetization, and a tunnel barrier layer between the first and second layer; and a field line for passing a field current such as to generate an external magnetic field adapted to switch the first magnetization; the first magnetic layer being arranged such that the magnetic tunnel junction magnetization varies linearly with the generated external magnetic field.

WO2013123363 discloses an apparatus that includes a circuit and a field line. The circuit includes a magnetic tunnel junction including a storage layer and a sense layer. The field line is configured to generate a magnetic field based on an input signal, where the magnetic tunnel junction is configured such that a magnetization direction of the sense layer and a resistance of the magnetic tunnel junction vary based on the magnetic field. The circuit is configured to amplify the input signal to generate an output signal that varies in response to the resistance of the magnetic tunnel junction.

US2006092689 discloses a reference current source for a magnetic memory device is preferably configured with magnetic tunnel junction cells and includes more than four reference magnetic memory cells to improve reliability of the magnetic memory device and to reduce sensitivity at a device level to individual cell failures. The reference current source includes a large number of magnetic memory cells coupled in an array, and a current source provides a reference current dependent on the array resistance. In another embodiment a large number of magnetic memory cells are coupled to current sources that are summed and scaled to produce a reference current source. A current comparator senses the unknown state of a magnetic memory cell.

SUMMARY

The present disclosure concerns a magnetic device configured to perform an analog adder circuit function, the magnetic device comprising a plurality of magnetic units, each of the plurality of magnetic units including:

n magnetic tunnel junctions, each magnetic tunnel junction comprising a storage magnetic layer having a storage magnetization, a sense magnetic layer having a sense magnetization that can be varied with respect to the storage magnetization, and a tunnel barrier layer between the first and second layer;

a current line electrically connecting in series said n magnetic tunnel junctions;

n input lines, each input line being configured to generate a magnetic field adapted for varying a direction of the sense magnetization and a junction resistance of one of said n magnetic tunnel junctions, based on an input; and wherein each of the plurality of magnetic units is configured to add said n inputs to generate an output signal that varies in response to the n junction resistances of said n magnetic tunnel junctions.

The present disclosure further concerns a method for operating the magnetic device, comprising:

providing an input to each of the input lines such as to generate a magnetic field adapted for varying a direction of the sense magnetization and a junction resistance of the corresponding magnetic tunnel junction; and measuring an output signal of the magnetic device.

Using such magnetic units allows the magnetic device to have any number of inputs, such that building a 3, 4 or n-inputs adder is straightforward.

Moreover, the magnetic device requires no in-situ programming. The magnetic device is directly functional after its fabrication including an initial annealing setting of the storage magnetization pinning direction.

In the magnetic device disclosed herein, the output is not electrically connected to the inputs. An advantage of this configuration is the absence of leakages as well as risks of destruction of the output section due to voltage overshoots in the inputs.

Process induced variability can be compensated by using several magnetic units in serial/parallel configurations.

In one embodiment, said at least a first and a second magnetic unit comprises n magnetic tunnel junctions and n input lines; wherein each magnetic units is configured to add n inputs to generate an output signal that varies in response to n resistances of the n magnetic tunnel junctions.

In another embodiment, the storage magnetization and the sense magnetization are configured such that said junction resistance varies linearly when the direction of the sense magnetization is varied. The output signal (or measured output resistance) is directly proportional to the sum of the input currents.

BRIEF DESCRIPTION OF THE DRAWINGS

The invention will be better understood and other advantages of the invention will become apparent with the aid of the description of an embodiment given by way of example and illustrated by the figures, in which.

DETAILED DESCRIPTION OF POSSIBLE EMBODIMENTS

Figure 1:
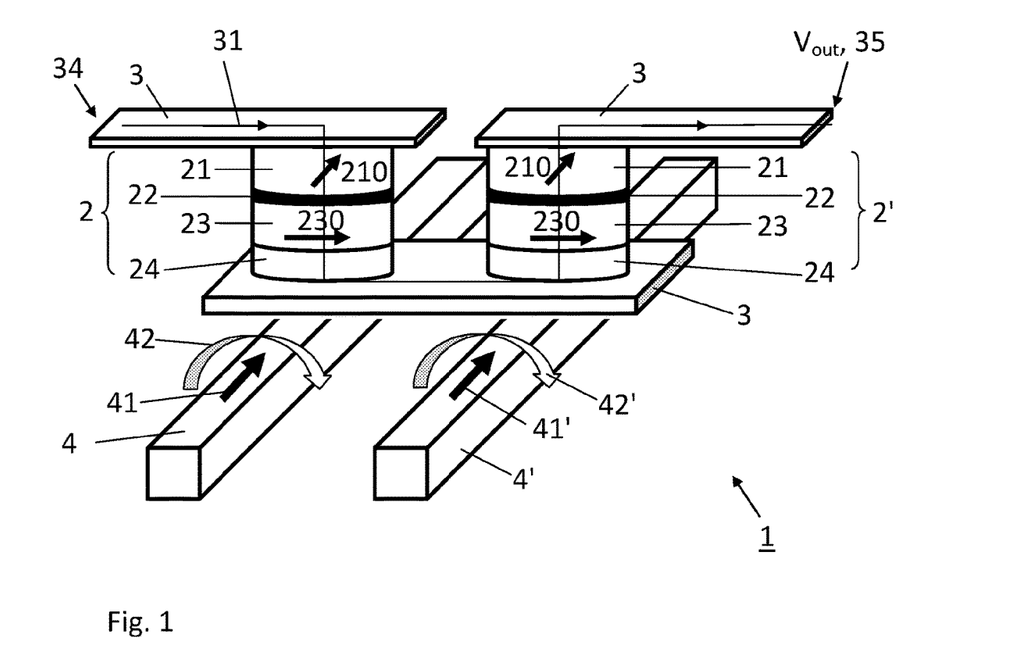
FIG. 1 shows a magnetic unit configured to perform an analog adder circuit function with two inputs, according to an embodiment.

FIG. 1 shows a magnetic unit 1 configured to perform an analog adder circuit function, according to an embodiment. The magnetic unit 1 comprises a first magnetic tunnel junction 2 and a second magnetic tunnel junction 2'. Each magnetic tunnel junction 2, 2' includes a storage layer 23 having a storage magnetization 230, a sense layer 21 having a sense magnetization 210 that can be varied with respect to the storage magnetization 230, and a tunnel barrier layer 22 between the sense and storage layers 21, 23. The first and second magnetic tunnel junctions 2, 2' are electrically connected in series via a current line 3.

The magnetic unit 1 further comprises a first input line 4 located below the first magnetic tunnel junction 2. The first input line 4 is configured such as to generate a first magnetic field 42 when a first input signal 41 is provided to the first input line 4. The first magnetic field 42 is adapted for varying a direction of the sense magnetization 210 and a first junction resistance $R_1$ of the first magnetic tunnel junction 2.

The magnetic unit 1 further comprises a second input line 4' located below (or at any other appropriate locations) the second magnetic tunnel junction 2'. The second input line 4' is configured such as to generate a second magnetic field 42' when a second input signal 41' is provided to the second input line 4'. The second magnetic field 42' is adapted for varying a direction of the sense magnetization 210 and a second junction resistance $R_2$ of the second magnetic tunnel junction 2'.

Each of the sense layer 21 and the storage layer 23 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 21 and the storage layer 23 can include the same ferromagnetic material or different ferromagnetic materials. The sense layer 21 can include a soft ferromagnetic material, namely one having a relatively low coercivity, while the storage layer 23 can include a hard ferromagnetic material, namely one having a relatively high coercivity. In such manner, a magnetization of the sense layer 21 can be readily varied under low-intensity magnetic fields generated in response to the input signals 41, 41' while the storage magnetization 230 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni 8oFe 2o); alloys based on Ni, Fe, and boron ("B"); CoFe; and alloys based on Co, Fe, and B. In some instances, alloys based on Ni and Fe (and optionally B) can have a smaller coercivity than alloys based on Co and Fe (and optionally B). A thickness of each of the sense layer 21 and the storage layer 23 can be in the nm range, such as from about 1 nm to about 20 nm. Other implementations of the sense layer 21 and the storage layer 23 are contemplated. For example, either, or both, of the sense layer 21 and the storage layer 23 can include multiple sub-layers in a fashion similar to that of the so-called synthetic antiferromagnetic layer.

The tunnel barrier layer 22 includes, or is formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 10 nm.

In the variant illustrated in FIG. 1, each magnetic tunnel junction 2, 2' also includes a pinning layer 24, which is disposed adjacent to the storage layer 23 and, through exchange bias, stabilizes the storage magnetization 230 along a particular direction when a temperature within, or in the vicinity of, the pinning layer 24 is at a low temperature threshold $T_L$. The pinning layer 24 unpins, or decouples, the storage magnetization 230 when the temperature is at a high temperature threshold $T_H$, thereby allowing the storage magnetization 230 to be switched to another direction.

In one embodiment, such a pinning layer is omitted adjacent to the sense layer 21, and, as a result, the sense layer 21 has a sense magnetization 210 that is unpinned and is readily varied, with the substantial absence of exchange bias.

The pinning layer 24 includes, or is formed of, a magnetic material and, in particular, a magnetic material of the antiferromagnetic type. Suitable antiferromagnetic materials include transition metals and their alloys. For example, suitable antiferromagnetic materials include alloys based on manganese (Mn), such as alloys based on iridium (Ir) and Mn (e.g., IrMn); alloys based on Fe and Mn (e.g., FeMn); alloys based on platinum (Pt) and Mn (e.g., PtMn); and alloys based on Ni and Mn (e.g., NiMn). In some instances, the blocking temperature T Bs of alloys based on Ir and Mn (or based on Fe and Mn) can be in the range of about 120° C. to about 220° C. or about 150° C. to about 200° C., such as about 200° C., and can be smaller than the blocking temperature T Bs of alloys based on Pt and Mn (or based on Ni and Mn), which can be in the range of about 300° C. to about 350° C.

In one embodiment, the input lines 4, 4' may be positioned underneath the current line 3 connecting the two magnetic tunnel junctions 2, 2' of the magnetic unit 1 (for example, at about 50 nm).

The magnetic tunnel junctions 2, 2' are further configured to add said first and second input signal 41, 41' to generate an output signal $V_{out}$ that varies in response to the first and second junction resistances $R_1$, $R_2$ of the first and second magnetic tunnel junctions 2, 2', respectively. The output signal $V_{out}$ may flow through current line 3, and may be measured across output terminals 34 and 35.

In one embodiment, the first input signal 41 includes an input current flowing in the first input line 4 such that a first magnetic field 42 generated by the first input signal 41, is coupled to the first magnetic tunnel junction 2. The second input signal 41' also includes a current current flowing in the second input line 4' such that a second magnetic field 42' generated by the second input signal 41', is coupled to the second magnetic tunnel junction 2'.

Other configurations of the magnetic unit 1 are also contemplated. For example, the magnetic unit 1 can comprises more than two magnetic tunnel junctions. In one embodiment shown in FIG. 3, the magnetic unit 1 further comprises a third magnetic tunnel junction 2" and a fourth magnetic tunnel junction 2'''. A third input line 4" is configured to generate a third magnetic field 42" adapted for varying a direction of the sense magnetization 210 and a third junction resistance $R_3$ of the third magnetic tunnel junction 2", based on a third input signal 41". A fourth input line 4'" configured to generate a fourth magnetic field 42'" adapted for varying a direction of the sense magnetization 210 and a fourth junction resistance $R_4$ of the fourth magnetic tunnel junction 2'", based on a fourth input signal 41'". The magnetic unit 1 is configured to add said first, second, third and fourth input signals 41, 41', 41", 41'" to generate an output signal $V_{out}$ that varies in response to the first, second, third and fourth junction resistances $R_1$, $R_2$, $R_3$, $R_4$ of the first, second, third and fourth magnetic tunnel junctions 2, 2', 2", 2'", respectively.

The magnetic unit 1 can also comprise n magnetic tunnel junctions and n input lines. Each of the n magnetic units 1 is configured to add n inputs to generate an output signal $V_{out}$ that varies in response to n resistances of the n magnetic tunnel junctions.

When the input signal is zero (e.g., zero input current), the sense magnetization 210 and the storage magnetization 230 can be naturally substantially anti-aligned (e.g., substantially antiparallel), resulting in a series resistance $R_{out}$ (corresponding to the sum of the junction resistances) per magnetic unit that is high. When the input signal is sufficiently large (above a threshold input value), the sense magnetization 210 becomes substantially aligned (e.g., substantially parallel) with the storage magnetization 230, resulting in a series resistance $R_{out}$ per magnetic unit that is low. In such a configuration, the value of the series resistance $R_{out}$ decreases with the input signal increasing above the threshold input value. The value of the series resistance $R_{out}$, and in particular the ratio between the series resistance, will depend on forming the sense layer 21 and/or the storage layer 23 from different choices of materials, material concentrations, and/or material thicknesses.

In a preferred embodiment, the series resistance $R_{out}$ varies linearly with the varying input signal 41, 41', 41", 41'".

In one embodiment, each magnetic tunnel junction 2, 2', 2", 2'" comprises an easy axis aligned along the direction of the input line 4, 4', 4", 4'". The easy axis can be achieved from shape or magnetocrystalline anisotropy of the magnetic tunnel junction 2, 2', 2", 2'". The storage magnetization 230 is then aligned and pinned in a direction that is substantially perpendicular to the easy axis (thus substantially orthogonal to the direction of the input line). Aligning the storage magnetization 230 can be achieved by performing an annealing step under a strong and constant magnetic field. The easy axis direction and alignment of the storage magnetization 230 can be performed during the fabrication and deposition of the magnetic tunnel junctions 2, 2', 2", 2'".

In this configuration, when the input signal 41, 41', 41", 41'" is zero the sense magnetization 210 is oriented in an initial direction substantially perpendicular to the storage magnetization 230 and parallel to the input line 4, 4', 4", 4'". The sense magnetization 210 is gradually aligned substantially parallel or antiparallel to the storage magnetization 230 by increasing an amplitude of the input signal 41, 41', 41", 41'" is passed in the input line 4, 4', 4", 4'" (the input signal does not need to be above a threshold input value to align the sense magnetization 210).

Figure 2:
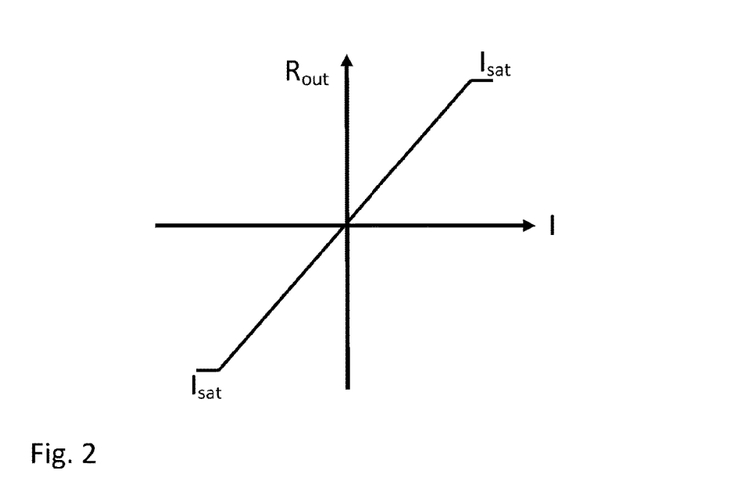
FIG. 2 represents a variation of a resistance of the magnetic unit with the amplitude of an input current.
Figure 3:
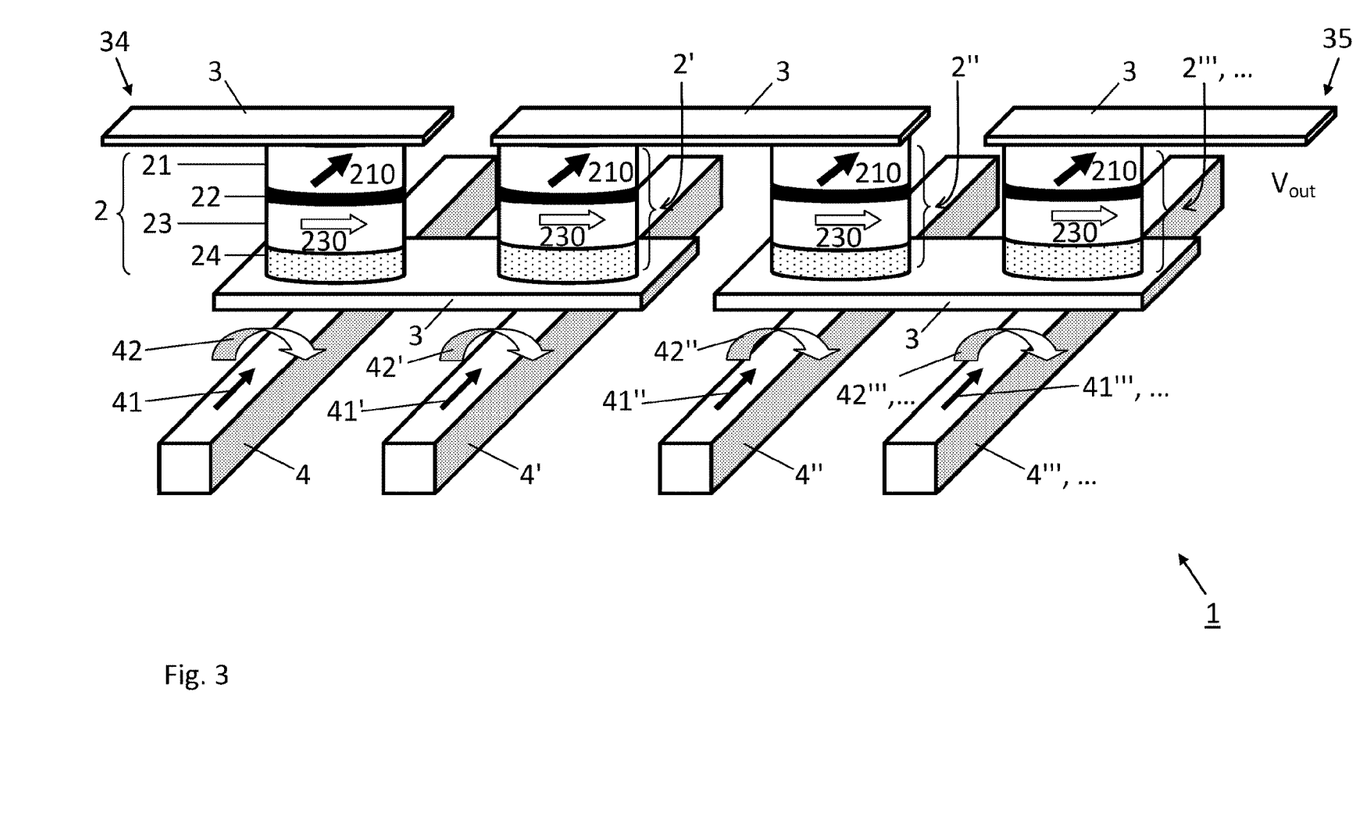
FIG. 3 shows a magnetic unit configured to perform an analog adder circuit function with four inputs, according to another embodiment.

In the exemplary embodiment of FIG. 3, the input signal includes an input current 41, 41', 41", 41'" flowing in the input line 4, 4', 4", 4'" and generating a magnetic field 42, 42', 42", 42'" oriented substantially parallel to the input line 4, 4', 4", 4'" and perpendicular with the initial direction of the sense magnetization 210. The graph of FIG. 2 reports a linear variation of the resistance $R_1$, $R_2$, $R_3$, $R_4$ of the first, second, third or fourth magnetic tunnel junctions 2, 2', 2", 2'", (corresponding to the variation in the sense magnetization 210) with the amplitude of the corresponding input current 41, 41', 41", 41'" (represented by I in FIG. 2) until a saturation input current $I_{sat}$ where the sense magnetization 210 is substantially parallel to the storage magnetization 230.

The saturation input current $I_{sat}$ is individual to each input 41, 41', 41", 41'". This implies that the current range available for an input is completely independent on the signal injected in the other inputs. In contrast, an adder based on operational amplifiers feature a common saturation behavior on the output.

A magnetic device 100 configured to perform an analog adder circuit function can be formed by assembling a plurality of magnetic units 1. In one embodiment illustrated in FIG. 4, a two-input magnetic device 100 comprises four magnetic units 1 electrically connected in series along a first input line 4 and a second input line 4'. The adjacent magnetic units 1 are electrically connected via the current line 3 having a curved and/or serpentine shape.

Figure 4:
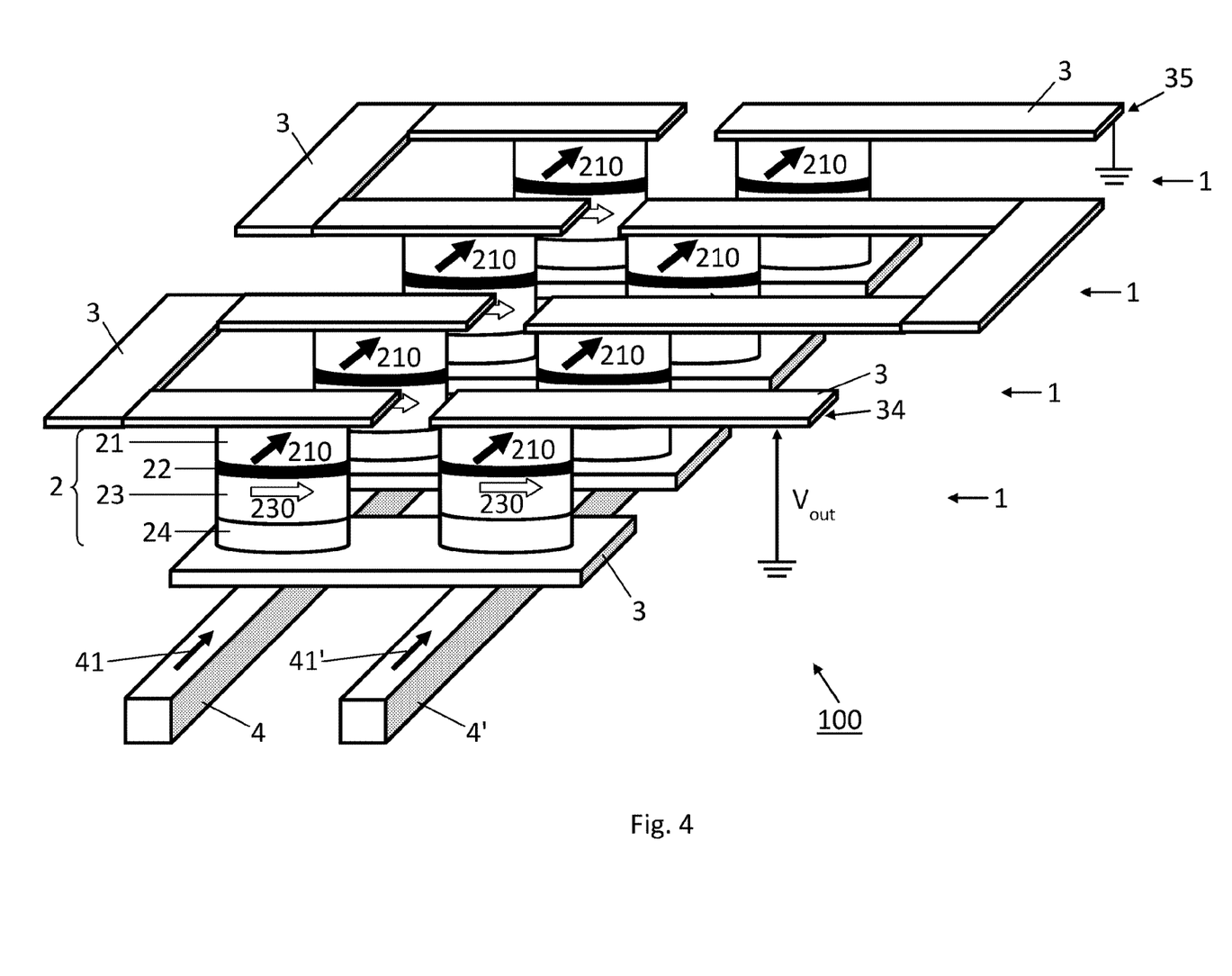
FIG. 4 illustrates a magnetic device comprising a plurality of magnetic units configured to perform an analog adder circuit function with two inputs, according to an embodiment.

The magnetic device 100 may include any number of magnetic units 1. For example, the magnetic device 100 may comprise n magnetic units 1 where n can be equal to any number, for example up to 100 or 500.

The magnetic units 1 included in the magnetic device 100 may be arranged in an array with Np parallel rows of magnetic units 1, each row having Ns magnetic units 1 in series. This array may be compact. For example, 50,000 magnetic units 1 may fit in a footprint with an area in the range from about 0.1 to about 0.5 square millimeters.

In a variant, each of the magnetic units 1 of the magnetic device 100 can comprise more than two magnetic tunnel junctions and two input lines. For example, a four-input magnetic device 100 can be obtained by electrically connecting in series magnetic units 1 comprising four magnetic tunnel junctions 2, 2', 2", 2'" and four input lines 4, 4', 4", 4'", such as the one shown in FIG. 3.

Figure 5:
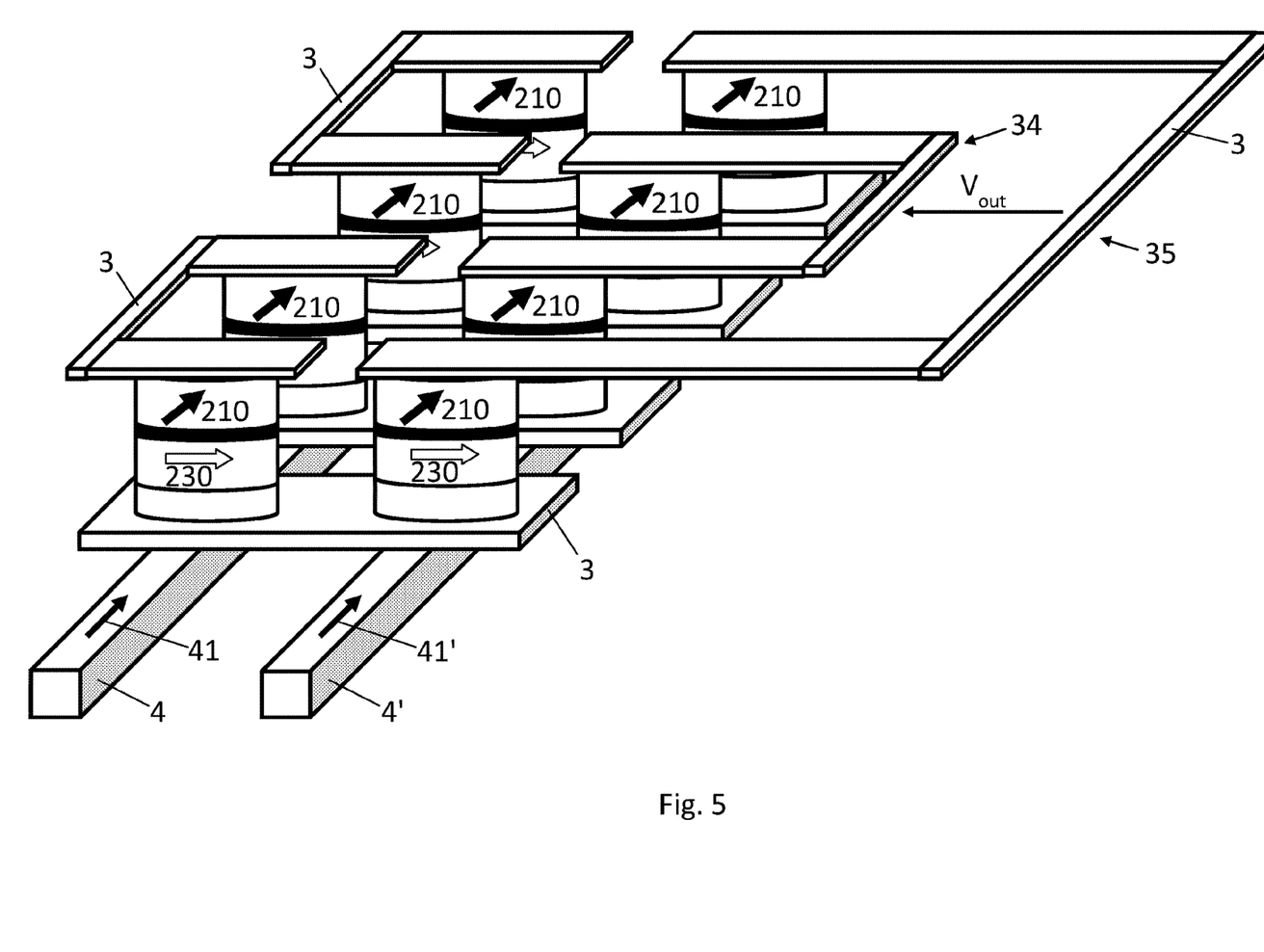
FIG. 5 illustrates a magnetic device comprising a plurality of magnetic units configured to perform an analog adder circuit function with two inputs, according to another embodiment.

In another embodiment illustrated in FIG. 5, a two-input magnetic device 100 comprises four magnetic units 1 electrically connected in parallel along a first input line 4 and a second input line 4'. In particular, the magnetic device 100 comprises two branches each including two magnetic units 1 electrically connected in series. The two-input magnetic device 100 of FIG. 5 can also comprise n branches each including two magnetic units 1 electrically connected in series. Each magnetic unit 1 can further comprise four magnetic tunnel junctions 2, 2', 2", 2'" and four input lines 4, 4', 4", 4'", such as to obtain a four-input magnetic device 100.

The magnetic device 100 may include bias circuitry (not shown) that supplies the input signals 41, 41', 41", 41'". The bias circuitry may include circuitry that supplies a sense current 31 (see FIG. 1) to facilitate generation of the output signal $V_{out}$. The magnetic device 100 may be solely driven externally through its input 41, 41', 41", 41'" and output terminals 34, 35.

The output signal $V_{out}$ of the magnetic device 100 is measured across output terminals 34 and 35 and results from an average of the output signal $V_{out}$ of the plurality of magnetic units 1 (the output signal $V_{out}$ varies in response to the n junction resistances $R_1$, $R_2$, $R_3$, $R_4$ of the n magnetic tunnel junctions 2, 2', 2", 2'" for each magnetic unit 1.

In the case the series resistance $R_{out}$ varies linearly with the varying input signal 41, 41', 41", 41'", the junction resistance $R_1$, $R_2$, $R_3$, $R_4$, and thus the output signal $V_{out}$, are directly proportional to the sum of the input currents 41, 41', 41", 41'".

In one embodiment, a method for operating the magnetic device 100 comprises:

providing an input 41, 41', 41", 41''' to each of the input lines 4, 4', 4", 4''' such as to generate a magnetic field 42, 42', 42", 42''' adapted for varying a direction of the sense magnetization 210 and a junction resistance $R_1$, $R_2$, $R_3$, $R_4$ of the corresponding magnetic tunnel junction 2, 2', 2", 2'''; and measuring an output signal $V_{out}$ of the magnetic device 100.

In an embodiment, the storage magnetization 230 is pinned in a direction being substantially perpendicular to the direction of the input lines 4, 4', 4", 4'''. The direction of the sense magnetization 210 is varied from an initial direction substantially perpendicular to the direction of the storage magnetization 230 to a direction substantially parallel or antiparallel to the direction of the storage magnetization 230.

REFERENCE NUMBERS AND SYMBOLS 1 magnetic unit
100 magnetic device
2 magnetic tunnel junction
21 sense layer
210 sense magnetization
22 tunnel barrier layer
23 storage layer
230 storage magnetization
24 pinning layer
3 current line
31 sense current
34 output terminal
35 output terminal
4 first input line
4' second input line
4" third input line
4''' fourth input line
41 first input
41' second input
41" third input
41''' fourth input
42 first magnetic field
42' second magnetic field
42" third magnetic field
42''' fourth magnetic field
$R_1$ first junction resistance
$R_2$ second junction resistance
$R_3$ third junction resistance
$R_2$ fourth junction resistance
$R_{out}$ series resistance
$T_H$ high temperature threshold
$T_L$ low temperature threshold
$V_{out}$ output signal

What is claimed is:

1. A magnetic device configured to perform an analog adder circuit function, the magnetic device comprising a plurality of magnetic units, each of the plurality of magnetic units including:

n magnetic tunnel junctions, each magnetic tunnel junction comprising a storage magnetic layer having a storage magnetization, a sense magnetic layer having a sense magnetization that can be varied with respect to the storage magnetization, and a tunnel barrier layer between the first and second layer;

a current line electrically connecting in series said n magnetic tunnel junctions;

n input lines, each input line being configured to generate a magnetic field adapted for varying a direction of the sense magnetization and a junction resistance of a corresponding one of said n magnetic tunnel junctions, based on a corresponding input, wherein the junction resistance of said corresponding one of said n magnetic tunnel junctions varies linearly based on said corresponding input; and wherein each of the plurality of magnetic units is configured to add said n inputs to generate an output signal that varies in response to the n junction resistances of said n magnetic tunnel junctions, and, characterized in that, each of the n input lines are independent of one another such that the n input lines can conduct n independent input signals so that the output signal can vary as a function of said n independent input signals.

2. The magnetic device according to claim 1, wherein n=2, such that the magnetic device has two inputs.

3. The magnetic device according to claim 1, wherein n=4, such that the magnetic device has four inputs.

4. The magnetic device according to claim 1, wherein said plurality of magnetic units comprises N magnetic units electrically connected in series along said n input lines.

5. The magnetic device according to claim 1, wherein said plurality of magnetic units comprises N magnetic units electrically connected in parallel along said n input lines.

6. The magnetic device according to claim 1, wherein said plurality of magnetic units comprises N magnetic units electrically connected in a series and/or parallel arrangement along said n input lines.

7. The magnetic device according to claim 1, wherein the current line is a serpentine.

8. The magnetic device according to claim 1, wherein the storage magnetization is pinned in a direction being substantially perpendicular to the direction of the input lines.

9. The magnetic device according to claim 1, wherein the magnetic tunnel junction comprises an anisotropy with an easy axis aligned substantially along a direction of the input lines.

10. A method for operating a magnetic device comprising a plurality of magnetic units, each of the plurality of magnetic units including: n magnetic tunnel junctions, each magnetic tunnel junction comprising a storage magnetic layer having a storage magnetization, a sense magnetic layer having a sense magnetization that can be varied with respect to the storage magnetization, and a tunnel barrier layer between the first and second layer; a current line electrically connecting in series said n magnetic tunnel junctions; n input lines, each input line being configured to generate a magnetic field adapted for varying a direction of the sense magnetization and a junction resistance of a corresponding one of said n magnetic tunnel junctions, based on a corresponding input, wherein the junction resistance of said corresponding one of said n magnetic tunnel junctions varies linearly based on said corresponding input and wherein each of the plurality of magnetic units is configured to add said n inputs to generate an output signal that varies in response to the n junction resistances of said n magnetic tunnel junctions, and, characterized in that, each of the n input lines are independent of one another such that the n input lines can conduct n independent input signals so that the output signal can vary as a function of said n independent input signals;

the method comprising:

providing an input to each of the input lines such as to generate a magnetic field for varying a direction of the sense magnetization and a junction resistance of the corresponding magnetic tunnel junction; and measuring an output signal of the magnetic device.

11. The method according to claim 10, wherein the storage magnetization pinned in a direction being substantially perpendicular to the direction of the input lines; and wherein the direction of the sense magnetization is varied from an initial direction substantially perpendicular to the direction of the storage magnetization to a direction substantially parallel or antiparallel to the direction of the storage magnetization.

* * * * *

UNITED STATES PATENT AND TRADEMARK OFFICE
CERTIFICATE OF CORRECTION

| | | |
|---|---|---|
| PATENT NO. | : 10,157,652 B2 | Page 1 of 1 |
| APPLICATION NO. | : 15/578841 | |
| DATED | : December 18, 2018 | |
| INVENTOR(S) | : Quentin Stainer | |

It is certified that error appears in the above-identified patent and that said Letters Patent is hereby corrected as shown below:

In the Claims

Claim 11 found at Column 9, Line 5: please insert the word -- is -- between the words "magnetization" and "pinned"

Signed and Sealed this
Ninth Day of April, 2019

Andrei Iancu
*Director of the United States Patent and Trademark Office*